United States Patent
Bollapragada et al.

(10) Patent No.: US 9,073,562 B2
(45) Date of Patent: Jul. 7, 2015

(54) SYSTEM AND METHOD FOR A SIMULATION BASED MOVEMENT PLANNER

(75) Inventors: Srinivas Bollapragada, Niskayuna, NY (US); Marc Anthony Garbiras, Clifton Park, NY (US); Mitchell Scott Wills, Melbourne, FL (US); Randall Bruce Markley, Melbourne, FL (US); Heath Jeffrey Morgan, Melbourne, FL (US); Joel Victor Kickbusch, Rockledge, FL (US); Mahir Erdem Telatar, Indialantic, FL (US)

(73) Assignee: General Electric Company, Schenectady, NY (US)

( * ) Notice: Subject to any disclaimer, the term of this patent is extended or adjusted under 35 U.S.C. 154(b) by 540 days.

(21) Appl. No.: 12/249,645

(22) Filed: Oct. 10, 2008

(65) Prior Publication Data
US 2009/0099825 A1    Apr. 16, 2009

Related U.S. Application Data

(60) Provisional application No. 60/960,775, filed on Oct. 12, 2007.

(51) Int. Cl.
*G06G 7/48* (2006.01)
*B61L 27/00* (2006.01)
*G06Q 10/04* (2012.01)
*G06F 17/50* (2006.01)

(52) U.S. Cl.
CPC ......... *B61L 27/0016* (2013.01); *G06F 17/5009* (2013.01); *B61L 27/0022* (2013.01); *B61L 27/0055* (2013.01); *B61L 27/0027* (2013.01); *B61L 27/0033* (2013.01); *G06Q 10/04* (2013.01)

(58) Field of Classification Search
CPC ............ B61L 27/0016; B61L 27/0022; B61L 27/0027; B61L 27/0033; B61L 27/0055; G06Q 10/04; G06F 17/5095; G06F 17/5009
USPC .............................. 703/8, 6; 701/19
See application file for complete search history.

(56) References Cited

U.S. PATENT DOCUMENTS

| 3,979,092 | A | * | 9/1976 | Perry et al. .................. 246/34 R |
| 5,623,413 | A | * | 4/1997 | Matheson et al. ............ 701/117 |
| 5,794,172 | A |  | 8/1998 | Matheson et al. |
| 5,828,979 | A |  | 10/1998 | Polivka et al. |

(Continued)

FOREIGN PATENT DOCUMENTS

| CN | 1683914 A | 10/2005 |
| DE | 10329258 A1 | 1/2005 |

(Continued)

OTHER PUBLICATIONS

Carey, Malachy, "A Model and Strategy for Train Pathing with Choice of Lines, Platforms, and Routes", Oct. 23, 1993, Elsevier Science Ltd. vol. 28-B, No. 5.*

(Continued)

*Primary Examiner* — Kamini S Shah
*Assistant Examiner* — Cedric D Johnson
(74) *Attorney, Agent, or Firm* — GE Global Patent Operation; John A. Kramer

(57) ABSTRACT

A system and method of planning the movement of plural trains over a network of track by simulating the movement of the trains over the network of track.

15 Claims, 3 Drawing Sheets

(56) References Cited

U.S. PATENT DOCUMENTS

| | | | |
|---|---|---|---|
| 6,135,396 A | | 10/2000 | Whitfield et al. |
| 6,154,735 A | * | 11/2000 | Crone .................... 706/45 |
| 6,459,964 B1 | * | 10/2002 | Vu et al. ................. 701/19 |
| 6,459,965 B1 | | 10/2002 | Polivka et al. |
| 7,092,894 B1 | | 8/2006 | Crone |
| 2004/0172175 A1 | * | 9/2004 | Julich et al. ............ 701/19 |
| 2005/0234757 A1 | * | 10/2005 | Matheson et al. ....... 705/8 |
| 2005/0261946 A1 | | 11/2005 | Howlett et al. |
| 2008/0128562 A1 | * | 6/2008 | Kumar et al. ........... 246/186 |
| 2010/0262321 A1 | * | 10/2010 | Daum et al. ............ 701/20 |

FOREIGN PATENT DOCUMENTS

| | | |
|---|---|---|
| EP | 1764280 A | 3/2007 |
| WO | 9606766 A | 3/1996 |
| WO | 03097425 A | 11/2003 |
| WO | 2004059446 A2 | 7/2004 |
| WO | 2007089441 A | 8/2007 |

OTHER PUBLICATIONS

Krueger, Harold, "Parametric Modeling in Rail Capacity Planning", 1999, Proceedings of the 1999 Winter Simulation Conference.*

Fernandez, A. et al. "Multi-Train Simulator for Regulation Purposes", May 3, 2002.*

Dessouky, Maged M. et al., "A Simulation Modeling Methodology for Analyzing Large Complex Rail Networks", May 26, 2004.*

Higgins, Andrew. et al., "Optimization of Train Timetables to Achieve Minimum Transit Times and Maximum Reliability", 1996, Proceedings of the 13th International Symposium on Transportation and Traffic Theory.*

Dessouky, Maged M. et al., "A Simulation Modeling Methodology for Analyzing Large Complex Rail Networks", Aug. 1995, Simulation, 65: 2, Simulation Councils, Inc.*

Higgins, A. et al., "Modeling the Number and Location of Sidings on a Single Line Railway", 1997, Computers Ops Res. vol. 24, No. 3, Elsevier Science Ltd.*

Tsuruta, Setsuo et al., "A Coordination Technique in a Highly Automated Train Rescheduling System", 1999, IEEE.*

Dorfman, M.J. et al., "Scheduling Trains on a Railway Network Using a Discrete Event Model of Railway Traffic", 2004, Transportation Research Part B 38, Elsevier Ltd.*

Zhou, Xuesong et al., "Bicriteria Train Scheduling for High-Speed Passenger Railroad Planning Applications", Sep. 11, 2004, European Journal of Operational Research 167, Elsevier B.V.*

Dalal, Malay A. et al., "Simulation Modeling at Union Pacific Railroad", 2001, Proceedings of the 2001 Winter Simulation Conference.*

Dalai, Malay A. et al., "Simulation Modeling at Union Pacific Railroad", 2001, Proceedings of the 2001 Winter Simulation Conference.*

European Patent Office, International Search Report in related International Application Ser. No. PCT/US2008/079817, mailed Feb. 18, 2009, p. 1-4.

* cited by examiner

SYSTEM AND METHOD FOR A SIMULATION BASED MOVEMENT PLANNER

The present application claims the priority of U.S. Provisional Patent Application Ser. No. 60/960,775 filed Oct. 12, 2007.

This disclosure is directed to a movement planner developed for solving the meet-pass planning or the movement-planning problem.

BACKGROUND

A movement plan is a detailed plan for moving trains in a rail network over a predetermined period of time. The movement plan begins with a list of scheduled activities, such as the times associated with origination, termination, crew change, engine change, train stop, assigned work, inspection and the like. Based on the scheduled activities the movement planner generates events such as meets, passes, railroad crossing at grade, planned hold, and safe space. A meet-pass involves planning the meet locations where trains traveling in opposite directions can get past each other. It also involves determining the pass locations where a fast train can get past a slower train traveling in the same direction. Currently, dispatchers typically develop movement plans manually. However, such manual development of movement plans is inadequate to efficiently plan the movement for large scale railroad operations.

Current Class 1 rail operations typically involve thirty to sixty thousand track miles and handle one to five thousand trains per day. The rails handle mixed traffic including bulk commodity, intermodal, manifest freight, automobile, passengers and others, each with their own scheduling characteristics. Typically the rail operations are broken into geographic sections with centralized dispatch centers controlling each section. Thus, a single train traversing many sections sees many dispatchers over its journey. A common problem associated with this type of train planning is that goals may not be communicated across sections and a movement plan that looks good to one dispatcher may actually harm the operation of the overall rail.

Computing a movement plan requires a variety of data including train schedules and operating costs, the topology of the rail network, speed restrictions and track blocks, real time status of the trains, and dispatcher inputs. A planning algorithm uses all this data to generate a near-optimal way to move trains.

One prior art approach using a computerized movement planner utilizes a technique known as simulated annealing. In this method, the scheduled trips for all trains are laid out using unopposed runtime. The planner then iteratively inserts or removes random delay at random points in a trip, searching for a maximum total plan value. The planner then searches for a better plan until the maximum number of trial is reached, or the change in the total plan value from the previous plan are not statistically significant.

The present disclosure is directed to a computerized movement planner that uses a computer simulation to model the details of the problem including the track topology, train schedules and activities. The computerized planner constructs the movement plan starting at the current time always ensuring feasibility. It achieves this by incrementally moving trains one at a time for a short duration and repeats the process until the trains have reached their destinations or the end of the horizon is reached.

DETAILED DESCRIPTION

Computing a movement plan requires a variety of data including train schedules and operating costs, the topology of the rail network, speed restrictions and track blocks, real time status of the trains, and dispatcher inputs.

Figure 1:
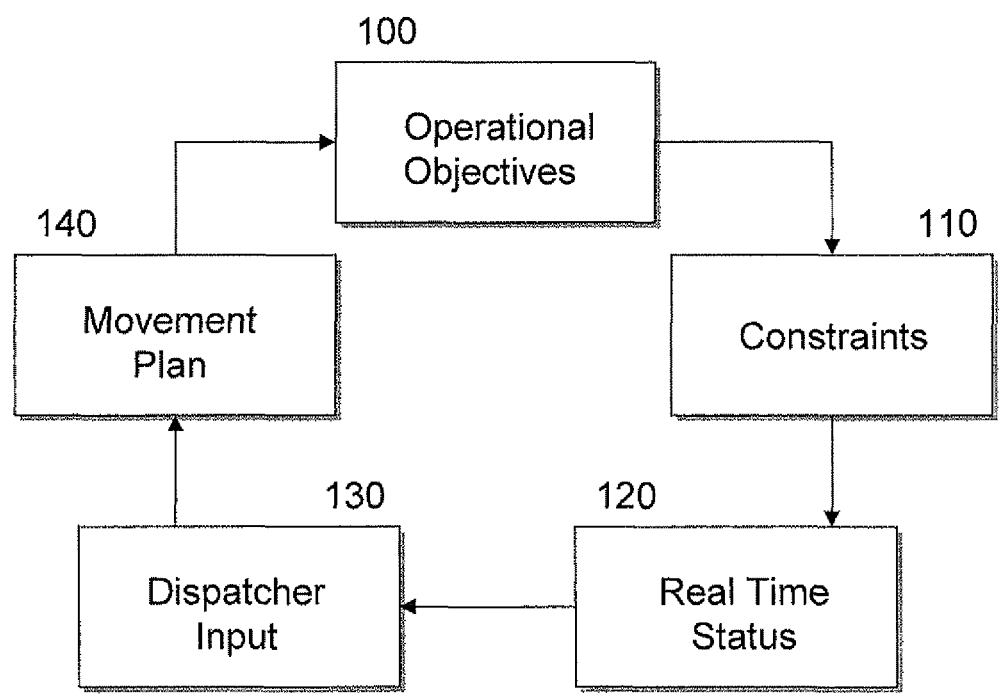
FIG. 1 is a simplified pictorial representation of a movement plan cycle for one embodiment of the present application.

With reference to FIG. 1, operational objectives 100 may include the train schedules, train priorities and the operating costs. The present disclosure ensures that the trains reach their destinations on time while respecting train priorities, which can be dynamic in nature to minimize the total cost incurred in moving the trains. To ensure that the operational objectives are met, the planner needs the train schedules including origin and destination locations, train priorities, crew expiration times, and desired crew change locations as inputs.

The planner also ensures that it meets a number of constraints 110 in developing the movement plan. A partial list of such constraints includes:

Track or Topology Based Constraints:
  Track blocks (indefinite or time based)
  Speed restrictions (indefinite or time based)
  Switch Constraints (indefinite or time based)
  Height, weight and width restrictions
  Siding constraints (multiple trains, crossings)
Train Based Constraints:
  Train priorities
  Train schedule changes
  Performance requirements—maximum possible velocities
  Key trains—special handling of trains carrying hazardous materials etc.
Activity Management Requirements:
  Crew changes
  Station activities
  Other on-track and off-track activities including combo, linked and helper trains The planner is capable of receiving real time status 120 of track and station activity, including location reports, delay reports, track obstructions, and consist and crew reports. The planner must also account for dispatcher initiated constraints 130 such as train authorities and locked meet and pass locations when generating a movement plan. Based on these inputs, the technical effect is the present disclosure generates a detailed plan for the movement of all scheduled trains along the track topology over the planning horizon for every train 140. The plan includes a schedule for performing all activities on trains including meets, passes, trains origination and termination, assigned work, inspection, crew change, engine change, etc.

Figure 2:
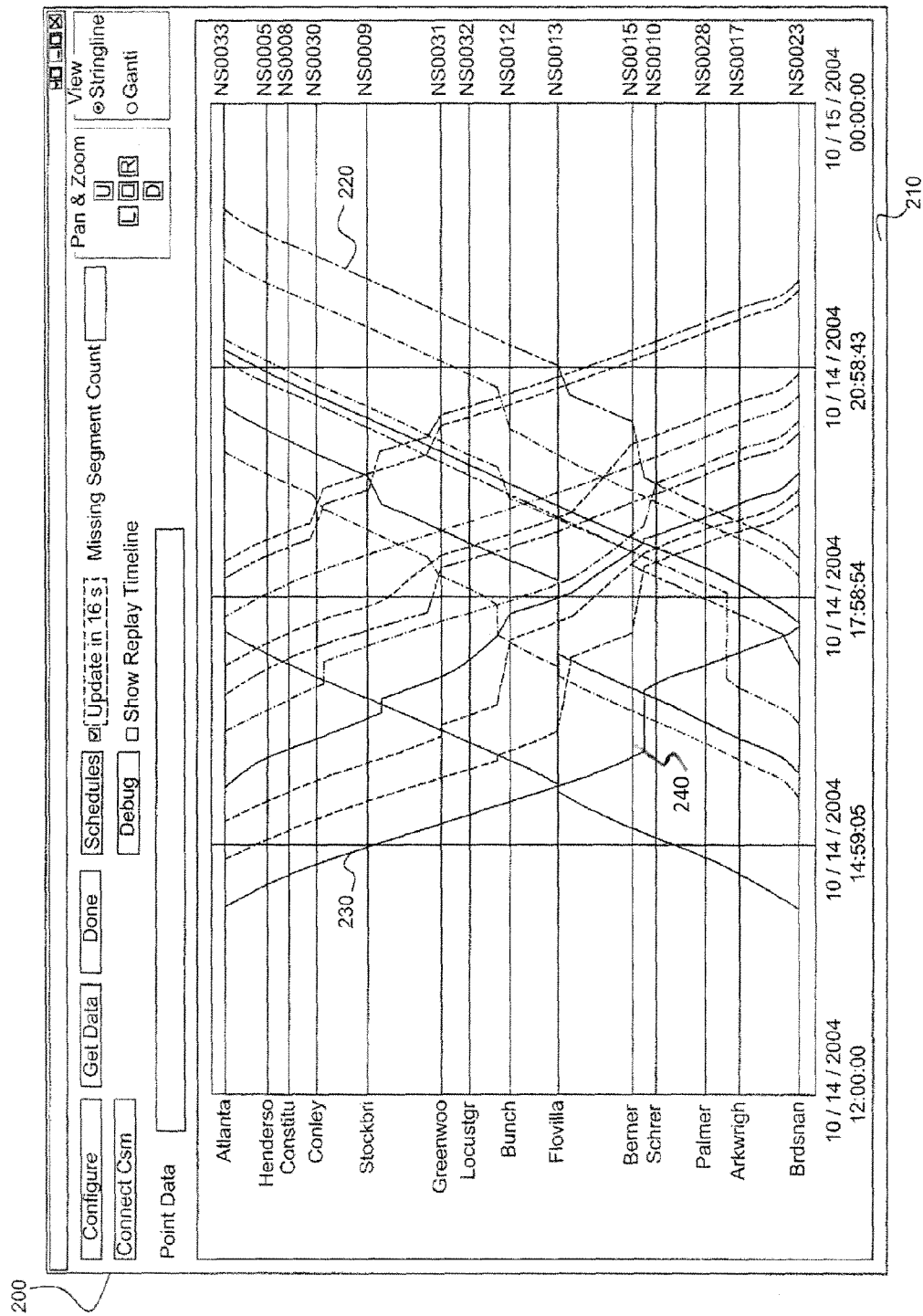
FIG. 2 is the simplified pictorial representation of a train graph provided by one embodiment of the present application.

FIG. 2 illustrates one example of movement plan generated by the present disclosure. A train graph is a tool for visualizing a movement plan. The track running from one end to the other is represented along the y-axis 200. The labels on the y-axis are the stations along the track. Time is represented along the x-axis 210. Each line in the graph shows the locations of a single train at various points in time. The upward sloping lines 220 represent trains traveling in the up-bound direction and the downward sloping lines 230 represent trains traveling in the down-bound direction. The slope of the lines at any given point is the velocity of the train at that point in time. The meet and passes locations can also be inferred from the train graph where the waiting train has a zero velocity 240.

Figure 3:
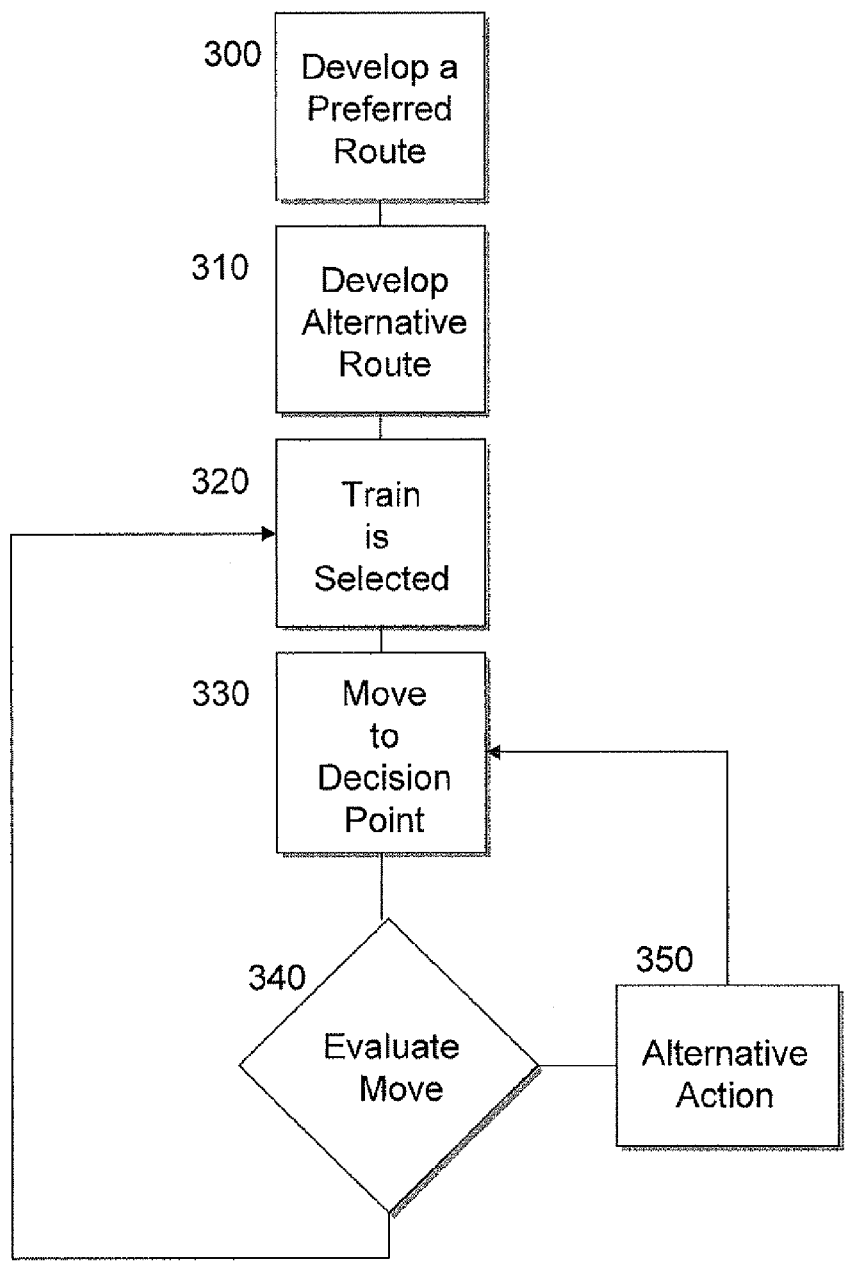
FIG. 3 is a simplified flow diagram of one embodiment of the present application.

The present disclosure uses a detailed simulation model, which simulates the track topology, and the movement of trains. It then builds schedules for each train in this simulation environment while moving the trains in a systematic manner from their current locations at the start of the planning cycle towards their respective destinations. A number of decisions have to be made in developing the movement plans. These decisions include the path that each train needs to take from origin to destination, the meet and pass locations in the planning horizon, the locations where activities such as crew changes need to performed, etc. There are many possible choices for each of these decisions. The real world movement-planning problem is extremely complex. Generating good feasible and stable solutions is very difficult. Many attempts that have been made earlier to solve this problem met with limited success. The present disclosure systematically explores the search space in a simulation environment to obtain a good solution that is robust With reference to FIG. 3, in one embodiment, the present disclosure develops a preferred route for each train 300. A preferred route is the best possible route that a train should take to achieve all its objectives in an optimal manner. In addition to the preferred route, a number of alternate routes are generated which bypass sections of the preferred route 310. One of the trains is selected 320 to simulate the movement thereof. The train to move may be selected based on a number of criteria including train priority, the delay the train has already incurred, the extent to which the train has already been advanced, etc. In one embodiment the train may be moved until it reaches a decision point 330. A decision point is a point at which more than one route may be available for a train including a switch where a train has a choice to go on one of the two or more different track segments that are available at that point such as a siding or alternate tracks. In other embodiments, the train may be moved for a predetermined amount of simulated time or until a situation arises when it cannot be moved further on its preferred route because of unavailability of track due to one of many reasons. These reasons include track blocks, tracks being occupied by other trains, etc. Once a train is moved to a decision point, an evaluation is made as to further movement of the train 340. For example, one evaluation may be a determination as to whether the next portion of the preferred route is available. If the track is available, the planner selects that train to move to the next decision point 320. If there is no feasible solution, the planner either delays the train at the destination point or backtracks and chooses an alternative route 350. The planner repeats this process for all trains until all trains reach their destinations or the end of the horizon is reached.

In one embodiment, when a train encounters a situation where it can no longer be moved along its preferred route, the planner resolves the situation in a systematic manner. A number of techniques may be used for resolving such situations including heuristic methods, math programming and other local optimization methods. The techniques employed may result in backtracking the trains, delaying them in their current locations and/or moving trains along paths that are alternate to the preferred route. The technical effect is the planner will advance the trains in a simulation environment in a systematic manner until all the trains reach their destinations or the end of the planning horizon is reached.

The following example illustrates operation of one embodiment of the present disclosure. The planner may sort trains in the ascending order based on time until which they are already scheduled to move from an initial point. It then chooses the first train in the sorted list and attempts to move the train along its preferred route. If a feasible segment exists, it advances the train until the next decision point. If there is no feasible solution, it either delays the train at its current location or backtracks and chooses the next best segment. It repeats this process until all trains reach their destinations or the end of the horizon is reached.

In order to ensure optimal movement of the trains, several metrics are considered in the simulated movement. In determining the movement of a train, the planner considers the following metrics:

Switches Per Train:

Number of times that a train switches from its preferred route to an alternate route. The planner attempts to minimize this metric.

Equal Value Passes:

Number of times when a train passes another train with equal value. The planner attempts to minimize this metric.

Crew Expirations:

Number of times that a crew shift expired during the schedule. The planner attempts to minimize this metric.

% of Meet and Pass Retained Between Plans:

This is a measure of the percentage of Meet and Passes that remain the same from one plan to the next. The planner tries to maximize this metric.

The planner may also provide metrics as the output of the planning cycle that can be used to compare with statistical norms, or to compare with other prior art techniques. Such output metrics include:

Algorithm Run Time:

Time (in seconds) it took the planner to generate the solution.

Average Train Velocity:

Average velocity of all trains with the train schedules generated by the planner. The metric is useful to a customer who may be interested both in the average velocity across all trains and average velocity by train group. It can be used to determine the number of train miles dispatched per day.

Average Delay Per Train:

This is measured from the latest time that a train reaches its destination.

Max. Possible Velocity:

Average velocity of trains if all trains were to run in their main route without any other traffic hindering their progress.

Unresolved Conflicts:

Number of occasions when two or main trains are on the same segment.

% Robustness:

This is a measure of the stability of a movement plan.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal that is generated to encode information for transmission to suitable receiver apparatus for execution by a computer. The computer readable medium can be a machine-readable storage device, a machine-readable storage substrate, a memory device, a composition of matter affecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, to name just a few.

Computer readable media suitable for storing computer program instructions and data include all forms of non volatile memory, media and memory devices, including by way of example semiconductor memory devices, e.g., EPROM, EEPROM; and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of What may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although a few embodiments have been described in detail above, other modifications are possible. Other embodiments may be within the scope of the following claims.

What is claimed:

1. A computer-implemented method of planning a movement of a plurality of trains over a network of track comprising the steps of:

determining selected routes for the plurality of trains from respective current or starting locations to respective destination locations;

determining at least one alternative route for each of the plurality of trains;

simulating, using one or more computers, movements of the trains along the selected routes to the respective destination locations, wherein the movements of the trains are iteratively simulated by switching between partially completed simulated movements of the trains to the respective destination locations until the movements of the trains that are simulated reach the respective destination locations;

receiving real time status updates of track activity and station activity in the network of track; and creating a movement plan for the plurality of trains based on the movements of the plurality of trains that are simulated and based on the real time status updates of the track activity and the station activity, the movement plan including schedules of activities of the plurality of trains for actually moving the trains in the network of track, wherein simulating the movements of the trains includes:
selecting a first train from the plurality of trains;
simulating the movement of the first train along the selected route of the first train to a first decision point, the first decision point comprising an intermediate point between a current location and the destination location of the first train;

evaluating the simulated movement of the first train, the evaluating comprising determining if a next portion of the selected route of the first train is available;

selecting a second train from the plurality of trains while simulation of the movement of the first train is held at the first decision point, the selection of the second train being based on which train from the plurality of trains is scheduled to leave on the selected route of the second train that is earliest with respect to time relative to when other trains of the plurality of trains are scheduled to leave;

simulating a movement of the second train along the selected route of the second train to a second decision point, while simulation of the movement of the first train is held at the first decision point, the second decision point comprising an intermediate point between a current location and the destination location of the second train;

evaluating the simulated movement of the second train, the evaluating comprising determining if a next portion of the selected route of the second train is available; and repeating the steps of selecting, simulating the movement, and evaluating the simulated movement for each of the plurality of trains to create the movement plan until at least one of a predetermined time is reached or all of the trains in the plurality of trains reach the respective final destinations of the trains, wherein the step of evaluating the simulated movement of the first train further comprises determining a percentage of meet and pass locations that remain the same from the selected route of the first train to another route of the first train, wherein the movement plan is created to increase the percentage of meet and pass locations that remain the same relative to a prior movement plan.

2. The computer-implemented method of claim 1 wherein the step of selecting the first train from the plurality of trains includes selecting the first train as a function of at least one of a delay the first train has already incurred, an extent to which how far the first train has already been advanced toward the final destination of the first train, or an extent to which how much time the first train already has been advanced toward the final destination of the first train.

3. The computer-implemented method of claim 1 wherein the step of selecting the first train and the step of selecting the second train select the same train.

4. The computer-implemented method of claim 3 wherein the movement of the second train that is simulated is back tracked to the first decision point responsive to the next portion of the selected route of the second train being determined as unavailable.

5. The computer-implemented method of claim 4 further comprising determining if another route is available for simulated movement by the second train at the first decision point following back tracking of simulating the movement of the second train.

6. The computer-implemented method of claim 3 wherein the simulated movement of the second train includes delaying simulation of the movement of the second train at the second decision point.

7. The computer-implemented method of claim 3 wherein the step of simulating the movement of the second train is along the at least one alternative route for the second train.

8. The computer-implemented method of claim 1 wherein repeating the steps of selecting, simulating, and evaluating are repeated by holding simulation of the movement of the second train at the second decision point, switching to simulating the movement of the first train or a third train until the first train or the third train reaches a third decision point, determining if a next portion of the selected route of the first train or the third train is available at the third decision point, holding up simulation of the movement of the first train or the third train when the next portion of the selected route is unavailable at the third decision point, and returning to simulating the movement of the second train at the second decision point.

9. The computer-implemented method of claim 1, wherein the first and second decision points are switches between different tracks.

10. The computer-implemented method of claim 1, wherein the real time status updates of the track activity and the station activity includes at least one of statuses of track obstructions, consist reports, or crew reports.

11. A non-transitory computer readable medium including programming steps that when executed by one or more processors perform a process, the process comprising:
determining selected routes for a plurality of trains over a network of track;
determining at least one alternative route for each of the plurality of trains;
simulating movements of the plurality of trains, said simulating comprising:
selecting a first train from the plurality of trains;
simulating, using one or more computers, a movement of the first train along a selected route of the first train to a first decision point, the first decision point comprising an intermediate point between a current location and a final destination of the first train;
evaluating the simulated movement of the first train, the evaluating comprising determining if a next portion of the selected route of the first train is available;
selecting a second train from the plurality of trains while simulation of the movement of the first train is held at the first decision point, the selection of the second train being based on which train from the plurality of trains is scheduled to leave on the selected route of the second train that is earliest with respect to time relative to when other trains of the plurality of trains are scheduled to leave;

simulating a movement of the second train along the selected route of the second train to a second decision point, while simulation of the movement of the first train is held at the first decision point, the second decision point comprising an intermediate point between a current location and a final destination of the second train;

evaluating the simulated movement of the second train, the evaluating comprising determining if a next portion of the selected route of the second train is available; and repeating the steps of selecting, simulating the movement, and evaluating the simulated movement for each of the plurality of trains until at least one of a predetermined time is reached or all of the trains in the plurality of trains reach the respective final destinations of the trains, wherein the step of evaluating the simulated movement of the first train includes determining a percentage of meet and pass locations that remain the same from the selected route of the first train to another route of the first train;

receiving real time status updates of track activity and station activity in the network of track; and creating a movement plan for the plurality of trains based on the movements of the plurality of trains that are simulated and based on the real time status updates of the track activity and the station activity, the movement plan including schedules of activities of the plurality of trains for actually moving the plurality of trains in the network of track, wherein the movement plan is created to increase the percentage of meet and pass locations that remain the same relative to a prior movement plan.

12. The computer readable medium of claim 11 wherein the movement of the second train that is simulated is back tracked to the first decision point responsive to the next portion of the selected route of the second train being determined as unavailable.

13. The computer readable medium of claim 11 wherein the first train is selected as a function of at least one of train priority, a delay the first train has already incurred, an extent to which how far the first train has already been advanced toward the final destination of the first train, or an extent to which how much time the first train already has been advanced toward the final destination.

14. The computer-implemented method of claim 11, comprising, while simulation of the movement of the second train is held at the second decision point, returning to simulating the movement of the first train to a next decision point on the selected route if the next portion of the selected route of the first train is available or on the at least one alternative route for the first train if the next portion of the selected route of the first train is not available.

15. The computer-implemented method of claim 11, wherein the real time status updates of the track activity and the station activity includes at least one of statuses of track obstructions, consist reports, or crew reports.

* * * * *